(12) United States Patent
Delgado et al.

(10) Patent No.: US 10,741,354 B1
(45) Date of Patent: Aug. 11, 2020

(54) PHOTOCATHODE EMITTER SYSTEM THAT GENERATES MULTIPLE ELECTRON BEAMS

(71) Applicant: KLA-TENCOR CORPORATION, Milpitas, CA (US)

(72) Inventors: Gildardo R. Delgado, Livermore, CA (US); Katerina Ioakeimidi, San Francisco, CA (US); Rudy Garcia, Union City, CA (US); Zefram Marks, Fremont, CA (US); Gary V. Lopez Lopez, Sunnyvale, CA (US); Frances A. Hill, Sunnyvale, CA (US); Michael E. Romero, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 37 days.

(21) Appl. No.: 16/106,272

(22) Filed: Aug. 21, 2018

Related U.S. Application Data (60) Provisional application No. 62/630,429, filed on Feb. 14, 2018.

(51) Int. Cl.
| | |
|---|---|
| H01J 37/00 | (2006.01) |
| H01J 37/073 | (2006.01) |
| H01J 37/22 | (2006.01) |
| G01N 23/20058 | (2018.01) |
| G02B 5/18 | (2006.01) |
| G02B 3/00 | (2006.01) |
| H01J 37/28 | (2006.01) |

(52) U.S. Cl.
CPC ...... H01J 37/073 (2013.01); G01N 23/20058 (2013.01); H01J 37/22 (2013.01); G01N 2223/6116 (2013.01); G02B 3/0006 (2013.01); G02B 5/1866 (2013.01); H01J 37/28 (2013.01)

(58) Field of Classification Search
CPC .......... H01J 37/073; H01J 37/22; H01J 37/28; G01N 23/20058; G01N 2223/6116; G02B 5/1866; G02B 3/0006
USPC .......... 250/306, 307, 310, 311, 492.1–492.3
See application file for complete search history.

(56) References Cited

U.S. PATENT DOCUMENTS

| | | | |
|---|---|---|---|
| 6,448,568 | B1 | 9/2002 | Allen et al. |
| 6,465,783 | B1 | 10/2002 | Nakasuji |
| 6,538,256 | B1 | 3/2003 | Mankos et al. |
| 6,924,885 | B2 | 8/2005 | Botma |

(Continued)

FOREIGN PATENT DOCUMENTS

| | | |
|---|---|---|
| CN | 101446773 A | 6/2009 |
| WO | 2016145458 A1 | 9/2016 |

OTHER PUBLICATIONS

Halavanau et al., Spatial control of photoemitted electron beams using a microlens-array transverse-shaping technique, Physical Review Accelerators and Beams, vol. 20, pp. 103404-1-103404-10, 2017.

(Continued)

*Primary Examiner* — Michael Maskell
(74) *Attorney, Agent, or Firm* — Hodgson Russ LLP (57) ABSTRACT

The system includes a photocathode electron source, diffractive optical element, and a microlens array to focus the beamlets. A source directs a radiation beam to the diffractive optical element, which produces a beamlet array to be used in combination with a photocathode surface to generate an array of electron beams from the beamlets.

18 Claims, 4 Drawing Sheets

(56) References Cited

U.S. PATENT DOCUMENTS

| | | | |
|---|---|---|---|
| 7,696,498 B2 | 4/2010 | Carroll | |
| 8,362,425 B2 | 1/2013 | Han et al. | |
| 2003/0122091 A1* | 7/2003 | Almogy | B82Y 10/00 |
| | | | 250/492.24 |
| 2003/0178583 A1 | 9/2003 | Kampherbeek et al. | |
| 2004/0108812 A1 | 6/2004 | Janaway et al. | |
| 2005/0264148 A1* | 12/2005 | Maldonado | H01J 37/073 |
| | | | 313/103 R |
| 2008/0023643 A1 | 1/2008 | Kruit et al. | |
| 2010/0320382 A1 | 12/2010 | Almogy et al. | |
| 2012/0161010 A1 | 6/2012 | Azzazy et al. | |
| 2015/0155134 A1* | 6/2015 | Frosien | H01J 37/05 |
| | | | 250/310 |
| 2017/0025243 A1 | 1/2017 | Ren et al. | |
| 2017/0276608 A1 | 9/2017 | Kanarowski et al. | |
| 2017/0307549 A1 | 10/2017 | Hesselink et al. | |

OTHER PUBLICATIONS

Chang et al., Multiple electron-beam lithography, Microelectronic Engineering, vols. 57-58, pp. 117-135, Sep. 2001 [Abstract Only].

Halavanau et al., Generation of Homogeneous and Patterned Electron Beams Using a Microlens Array Laser-Shaping Technique, Proceedings of IPAC2016, pp. 1-4, Downloaded May 19, 2016.

ISA/KR, International Search Report and Written Opinion for PCT/US2019/017407 dated May 29, 2019.

\* cited by examiner

PHOTOCATHODE EMITTER SYSTEM THAT GENERATES MULTIPLE ELECTRON BEAMS

CROSS-REFERENCE TO RELATED APPLICATIONS

This application claims priority to the provisional patent application filed Feb. 14, 2018 and assigned U.S. App. No. 62/630,429, the disclosure of which is hereby incorporated by reference.

FIELD OF THE DISCLOSURE

This disclosure relates to electron beam emitters.

BACKGROUND OF THE DISCLOSURE

Evolution of the semiconductor manufacturing industry is placing ever greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

As semiconductor devices become smaller, it becomes more important to develop enhanced inspection and review tools and procedures to increase the resolution, speed, and throughput of wafer and photomask/reticle inspection processes. One inspection technology includes electron beam based inspection such as use of a scanning electron microscope (SEM). An SEM uses an electron source. Electron sources can be divided into two broad groups: thermionic sources and field emission sources. Thermionic sources are usually made of tungsten or lanthanum hexaboride ($LaB_6$). In thermionic emission, electrons are boiled off the material surface when the electron thermal energy is high enough to overcome the surface potential barrier. Even though thermionic emitters are widely used, they typically require elevated temperatures (e.g., >1300 K) to operate, and may have several drawbacks such as inefficient power consumption, wide energy spread, short lifetime, low current density, and limited brightness. The demand for more efficient electron sources has driven the research and development of Schottky emitters and cold electron sources such as electron field emitters.

In the Schottky emitters, thermionic emission is enhanced by effective potential barrier lowering due to the image charge effect under an applied external electric field. Schottky emitters are typically made of a tungsten wire having a tip coated with a layer of zirconium oxide ($ZrO_x$), which exhibits a low work function (e.g., approximately 2.9 eV). Schottky emitters are currently used in some electron beam systems. Despite being quite successful, thermally-assisted Schottky emitters still need to be operated at high temperature (e.g., >1000 K) and high vacuum (e.g., approximately $10^{-9}$ mbar), and have wider than desirable electron emission energy spread due to the high operating temperature.

Cold electron sources, particularly electron field emitters, have been used in field emission displays, gas ionizers, x-ray sources, electron beam lithography, and electron microscopes, among other applications. Field emission takes place when the applied electric field is high enough to reduce the potential barrier on the tip-vacuum interface so that electrons can tunnel through this barrier at a temperature close to room temperature (e.g., quantum-mechanical tunneling). A typical field-emitter comprises a conical emitter tip with a circular gate aperture. A potential difference is established across the emitter cathode, the gate and the anode under an applied external field, resulting in high electric field at the surface of the tip. Electrons tunnel through the narrow surface barrier and travel towards an anode, which is biased at a higher potential than the gate. The emission current density can be estimated by a modified version of the Fowler-Nordheim theory, which takes into account the field enhancement factor due to the field emitters.

Field emitters, because they can operate near room temperature, have lower energy spread than Schottky and thermionic emitters, and can have higher brightness and electron current than thermionic emitters. However, in practical use, the output current of a field emitter is less stable because contaminants can easily stick to the tip of the emitter and raise its work function, and hence lower the brightness and current. Periodic flashing (i.e., temporarily raising the tip temperature) is required to remove those contaminants. While the tip is being flashed, the instrument is not available for operation. Instruments in the semiconductor industry are required to operate continuously and stably without interruption, so Schottky emitters are usually used in preference to cold field emitters.

Previous field emitter arrays (FEAs) had multiple conically shaped electron emitters arranged in a two-dimensional periodic array. These field emitter arrays can be broadly categorized by the material used for fabrication into two broad categories: metallic field emitters and semiconductor field emitters.

Thermal field emitters (TFE) were previously used to generate electron beams. An individual electron source was used to form an array. Each electron source requires expensive XYZ stages. The cost of each individual electron source system was expensive and cost-prohibitive for a large array. In addition, the electron current density was low.

Photocathodes also have been used to generate electron beams. A single light beam incident on a photocathode system can generate a single electron beam with high brightness that is capable of delivering high electron current density. However, a problem with single electron beam systems is that even with high brightness systems, single electron beam systems still have relative low throughput for inspection. Low throughput is a drawback to electron beam inspection. With current available electron beam sources, thousands of beams would be required.

Splitting the single electron beam into numerous beams for a multi-beam SEM system required an array of aperture lenses and/or micro-lenses. The array of aperture lenses and/or micro-lenses are set in small, electrically-charged apertures that are substantially round in design to create lens fields. If the apertures are out-of-round, astigmatism is introduced in the lens fields, which results in a distorted image plane.

Therefore, what is needed is an improved system to generate electron beams.

BRIEF SUMMARY OF THE DISCLOSURE

A system is provided in a first embodiment. The system comprises a diffractive optical element configured to receive an incident radiation beam, an extractor plate, a microlens array that provides collimation and focus of the beamlets, a condenser lens disposed between the diffractive optical element and the microlens array along the path of the beamlets, and a photocathode surface disposed between the microlens array and the extractor plate along the path of the beamlets. The diffractive optical element forms the beamlets from the incident radiation beam. The microlens array is disposed between the diffractive optical element and the extractor plate along a path of the beamlets. The photocathode surface generates a plurality of electron beams from the beamlets.

The system can further include a laser light source that generates the incident radiation beam.

The beamlets may be in an array.

The electron beams can have a density from 2 nA to 5 nA.

The electron beams can have a spatial separation from 50 µm to 10 mm.

100 to 1000 of the electron beams may be included.

The system can further include an electron beam column. In an instance, the electron beams are directed from the extractor plate at the electron beam column.

The system can include a plurality of the electron beam columns. In an instance, each of the electron beams is directed at one of the electron beam columns.

The beamlets each can have a spot size from 10 µm to 100 µm. The electron beams generated by the photocathode surface each can have a spot size from 10 µm to 100 µm.

The incident radiation beam may be ultraviolet radiation.

The system can further include a voltage source in electronic communication with the extractor plate.

A wafer inspection tool can include the system of the first embodiment.

A method is provided in a second embodiment. A radiation beam is generated and received at a diffractive optical element. A plurality of beamlets are formed from the radiation beam using the diffractive optical element. The beamlets are directed through a condenser lens. The beamlets are collimated and focused with a microlens array downstream of the condenser lens with respect to a direction the beamlets are projected. The beamlets from the microlens array are directed to a photocathode surface. A plurality of electron beams are generated from the beamlets using the photocathode surface. The electron beams are extracted from the photocathode surface.

The beamlets can be in an array ranging from 4×6 to 48×48

The electron beams can have a density from 2 nA to 5 nA.

100 to 1000 of the electron beams may be included.

The electron beams can have a spatial separation from 50 µm to 10 mm.

The beamlets each can have a spot size from 10 µm to 100 µm. The electron beams generated by the photocathode surface each can have a spot size from 10 µm to 100 µm.

The radiation beam may be ultraviolet radiation.

A pattern of the beamlets can be transmitted to the electron beams.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The system is designed for electron beam inspection of semiconductor wafers with high throughput. The system includes a photocathode electron source, diffractive optical element (DOE), lens system to parallelize the beamlets, and microlens array to focus the beamlets. Using a DOE with microlens array to produce collimated parallel beamlets on a photocathode surface can produce a patterned electron beam.

A photocathode system can provide high electron density per beam, which reduces the number of beams required. A multiple electron beam system can achieve high resolution with increased throughput. High speed and high resolution electron beams can be provided with a DOE lens system coupled to a photocathode element to generate a multi-electron beam system. A multiple electron beam inspection system using parallel data acquisition may increase the throughput and shorten the time to inspect a wafer or reticle.

Figure 1:
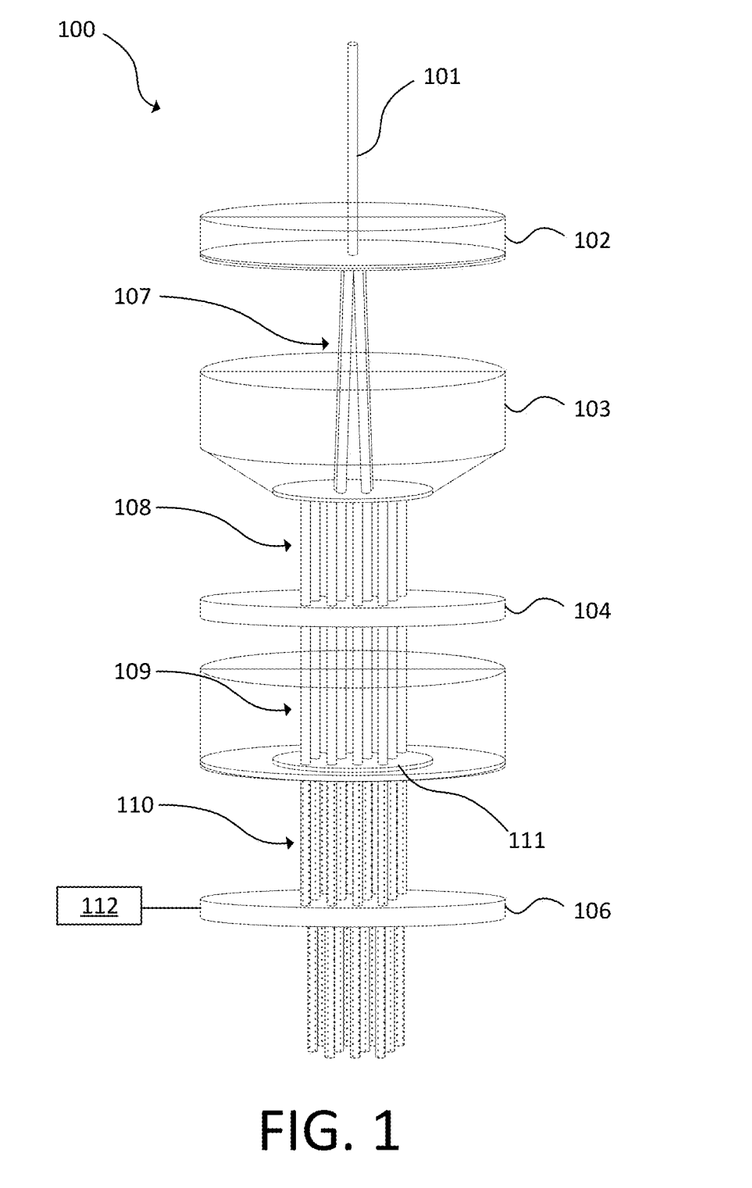
FIG. 1 is a view of a diffractive optical element photocathode array system to produce multiple electron beams.

FIG. 1 is a view of a diffractive optical element photocathode array system 100 to produce a multi-electron beam. A source directs a radiation beam 101 on the DOE 102, which will produce a beamlet array to be used in combination with a photocathode 111 surface to generate an array of electron beams 110. In particular, the radiation beam 101 impinging on DOE 102 forms an array of light beamlets 107 that impinge a microlens array 104. The microlens array 104 focuses the focused parallelized beamlets 109 to a photocathode surface 111. The photocathode surface 111 generates a multi-electron-beam pattern.

The light source that generates the incident radiation beam may be, for example, lasers, diodes, lamps, or broadband (BB) light sources. BB sources can be obtained from, for example, laser-produced plasmas, laser-sustained plasmas, laser-produced supercontinuum sources, white lasers, or largely tunable optical parametric sources. These sources can be continuous-wave (CW) or pulsed and can have wavelengths that range from vacuum ultraviolet (VUV) to the infrared (IR). A single wavelength can be selected with a suitable spectrometer or narrow or wide bands of wavelengths can be selected by filters or other methods.

In an embodiment, the light source is a laser light source or a diode. The incident radiation beam may be ultraviolet radiation. In an instance, the radiation beam 101 is light with a wavelength of 266 nm. The radiation beam may be generated such that it has low noise.

In another embodiment, the light source is a CW light source.

The system 100 includes a DOE 102, a condenser lens 103, a microlens array 104, a photocathode element 105 with a photocathode surface 111, and an extractor plate 106. Radiation from the source passes through the DOE 102, the condenser lens 103, and the microlens array 104 before being projected on the photocathode surface 111. The electron beams can be extracted from the photocathode surface 111 using the extractor plate 106.

Optical alignment of the microlens array 104 may impact output of the electron beams 110. Uniformity across the entire photocathode surface 111 and/or equivalent spot size in the focused parallelized beamlets 109 can affect performance. A light beam may be larger than the electron emitting aperture. A light beam also may be smaller than the electron beam limiting aperture. If the light beam is smaller than the electron beam limiting aperture, then a metrology alignment may be performed.

The DOE 102 receives an incident radiation beam 101. The DOE 102 forms a plurality of beamlets 107 from the incident radiation beam 101. The number of beamlets 107 produced by the DOE 102 may be the same as the number of beamlets exiting the condenser lens 103 or the number of electron beams 110 that are produced. Four beamlets 107 are illustrated exiting the condenser lens 103 for simplicity. Thus, the number of beamlets 107 can vary from that illustrated in FIG. 1. The number of beamlets 107 (and electron beams 110) can form an array. The array may include, for example, 4×6, 6×6, 1×10, 10×10, 10×100, 30×100, or other configurations of beamlets 107 and electron beams 110.

The condenser lens 103 is disposed between the DOE 102 and the microlens array; 104. The condenser lens 103 may adjust trajectory of the beamlets 107 and can be configured to provide an output of parallelized beamlets 108. The number of parallelized beamlets 108 equals the number of beamlets 107.

The microlens array 104 can provide collimation and focus of the parallelized beamlets 108. The microlens array 104 is disposed between the DOE 102 and the extractor plate 106. The parallelized beamlets 108 leaving the microlens array 104 are focused parallelized beamlets 109, which are focused at the cathode surface 111.

The photocathode surface 111 in the photocathode element 105 is disposed between the microlens array 104 and the extractor plate 106. The photocathode surface 111 generates a plurality of electron beams 110 from the focused parallelized beamlets 109. The photocathode surface 111 may be or may include a photosensitive compound. When struck by a photon, the photocathode surface 111 can cause electron emission due to the photoelectric effect.

In an embodiment, the photocathode element 105 can include bare metals, coated metals, cesium metal or alloys thereof, negative electron affinity (NEA) materials, a Zintl salt photocathode material, or alkali photocathode materials.

While twelve of the electron beams 110 are illustrated, the photocathode surface 111 can generate from 100 to 1000 or from 100 to 2500 the electron beams 110. The number of electron beams 110 can be scaled depending on the system design or the application.

The extractor plate 106 is opposite the DOE 102 with respect to a direction of travel of the beamlets 107. In an instance, the extractor plate 106 includes 20 µm diameter apertures, though other size apertures are possible. The extractor plate 106 can be in electronic communication with a voltage source 112. The voltage range can be from 0.1 KV to 50 KV. For high resolution inspection, the voltage range can be from 0.1 KV to 5 KV. Other voltages are possible, and these ranges are merely examples.

The DOE 102 can be designed to generate a desired number of beamlets with a desired spatial separation and pattern. Optical lenses can be used to form parallelized beamlets, but also to form and shape the light beams. The beamlets can be aligned to a microlens array 104 optics. The combination of DOE 102, optical elements, and the microlens array 104 can provide multiple beams of electrons having a desired spatial separation, spot size, and pattern.

In an example, radiation, such as ultraviolet radiation, in a collimated beam is directed onto the DOE 102. A focusing lens can be used to collimate individual beamlets and a microlens array 104 can focus the beamlets on the photocathode surface 111.

The design of the DOE 102 can define the number of the beamlets, a size of the array, and a desired spatial separation and pattern. The pattern imposed onto the beamlets is transmitted to the multiple electron beams 110 as these electron beams 110 are generated by the photocathode surface 111. Previous designs had difficulty producing an array of electron beams with the same size, arrangement, or other properties as the electron beams 110.

The beamlets, such as the parallelized beamlets 108 or the focused parallelized beamlets 109, can be in an array. The pattern of the beamlets can be transmitted to the electron beams 110. Thus, an array of beamlets can be transmitted to an array of electron beams 110.

The beamlets, such as the parallelized beamlets 108 or the focused parallelized beamlets 109, each can have a spot size from 10 µm to 100 µm. The electron beams 110 generated by the photocathode surface 111 each can have a spot size from 10 µm to 100 µm.

The electron beams 110 can have a density from 2 nA to 5 nA.

The electron beams 110 can have a spatial separation from 50 µm to 10 mm or more. Spatial separation of the electron beams 110 in the 10's of mm is possible.

The system 100 can include an electron beam column, which may be downstream of the extractor plate 106 relative to the direction of travel of the electron beams 110. The electron beam column can include components such as, for example, apertures, deflectors, scan coils, electromagnetic lenses, magnetic lenses, or detectors. The configuration of the electron beam column can vary with the particular application of the system.

The electron beams 110 can be directed at the electron beam column. In an instance, there are multiple electron beam columns. Each of the electron beams 110 can be directed at one of the electron beam columns. Each electron beam column can individually control one of the electron beams. Simultaneous use of multiple individually-controlled electron beams allows for corrections of each beam.

Embodiments disclosed herein allow formation of multiple beams of electrons by directing a small spot size (e.g., 10-100 μm) radiation (e.g., ultraviolet light) onto a suitable photocathode surface 111. The photocathode surface 111 can produce a small electron spot size (e.g., 10-100 μm). The electrons produced from the photocathode surface 111 can be accelerated by voltage applied to the extractor plate 106. The final spot of each electron beam 110 can be controlled by the electron optics.

Multi-electron beams from photocathodes using DOE with a microlens array can enable inspection of a mask or wafer in a few hours. Conventional methods may take months to perform the same inspection.

The photocathode surface 111 may be configured for the wavelength of the radiation beam 101. For example, the photocathode surface 111 may have different coatings or substrate materials depending on the wavelength of the radiation beam 101. For UV wavelengths down to 248 nm, fused silica or sapphire may be used as the substrate material. For wavelengths below 193 nm, $MgF_2$ or $CaF_2$ may be used. The material of the photocathode surface 111 can be chosen for optimal quantum efficiency (QE) and energy spread at a given wavelength.

Design of the DOE 102 may vary depending on the wavelength of the radiation beam 101 or the pitch of the beamlets 107. Material in the DOE 102 can be selected based on the wavelength that is used in the diffractive optical element photocathode array system 100. For UV wavelengths down to 248 nm, fused silica or sapphire may be used a material in the DOE 102. For wavelengths below 193 nm, $MgF_2$ or $CaF_2$ may be used.

Design of the condenser lens 103 or microlens array 104 can vary depending on the wavelength of the radiation beam 101 or the spot sizes of the beamlets 107 or parallelized beamlets 108. Material in the condenser lens 103 or microlens array 104 can be selected based on the wavelength that is used in the diffractive optical element photocathode array system 100. For UV wavelengths down to 248 nm, fused silica or sapphire may be used a material in the condenser lens 103 or microlens array 104. For wavelengths below 193 nm, $MgF_2$ or $CaF_2$ may be used.

The system 100 can increase throughput. A larger array of the electron beams 110 and/or a larger spot size of the electron beams 110 can increase throughput.

Figure 2:
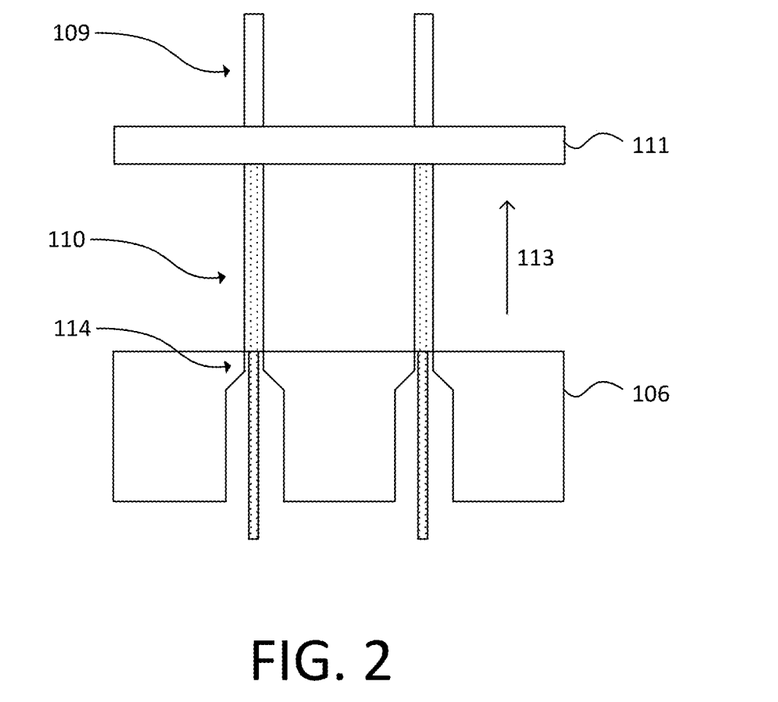
FIG. 2 illustrates electron beams that are extracted from the photocathode surface by providing voltage to an extractor plate creating an extraction field.

FIG. 2 illustrates electron beams 110 that are extracted from the photocathode surface 111 by providing voltage to an extractor plate 106 creating an extraction field (shown by the arrow 113). The extractor plate 106 defines a plurality of extraction apertures 114. As seen in FIG. 1, the electron beams 110 are formed from the focused parallelized beamlets 109.

Figure 3:
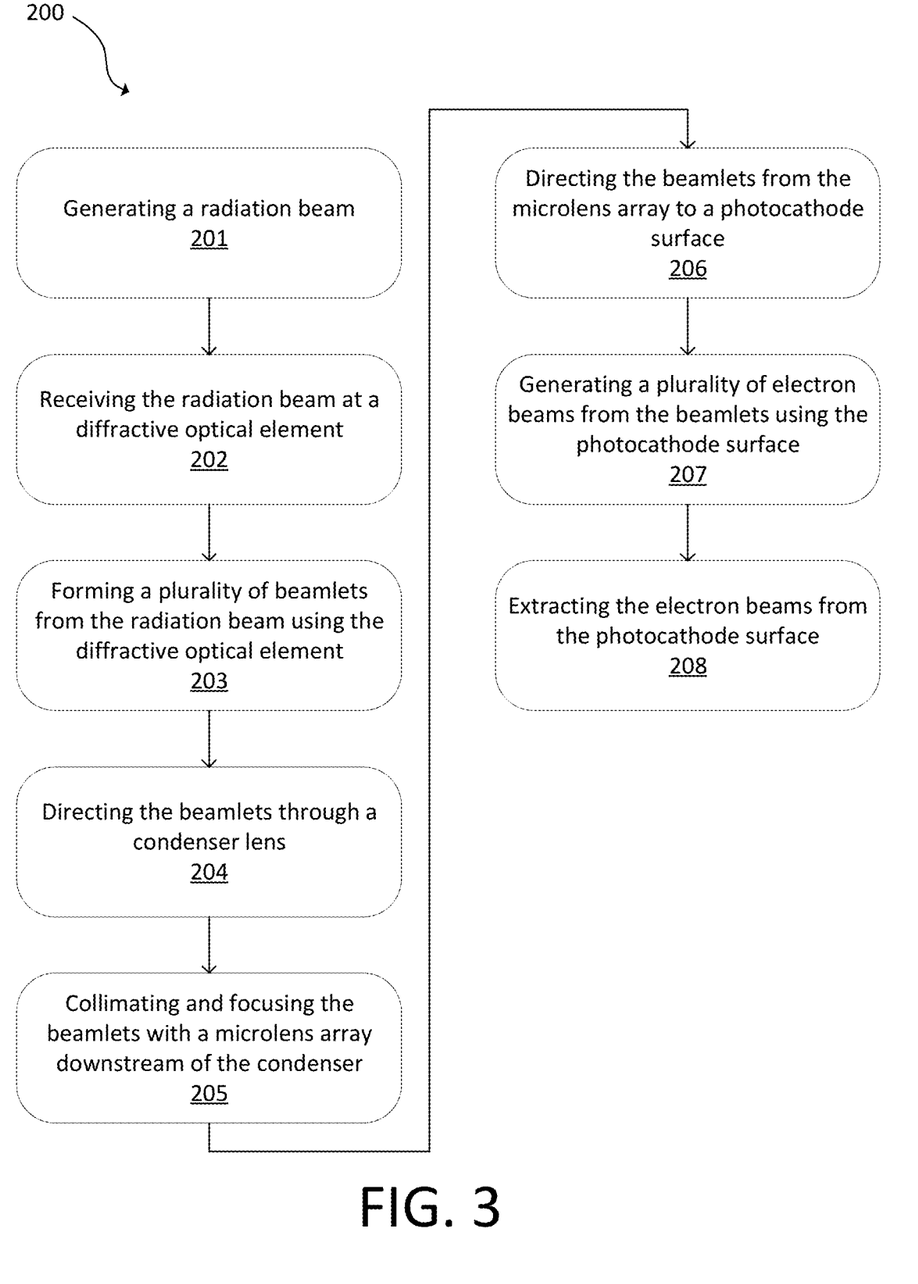
FIG. 3 is an embodiment of a method in accordance with the present disclosure.

FIG. 3 is an embodiment of a method 200. At 201, a radiation beam is generated. The radiation beam may be ultraviolet radiation or another wavelength of radiation. The radiation beam is received at a DOE at 202. A plurality of beamlets are formed from the radiation beam using the DOE at 203. The beamlets are directed through a condenser lens at 204. The beamlets are collimated and focused downstream of the condenser lens with a microlens array at 205. The downstream position may be with respect to a direction the beamlets are projected. At 206, the beamlets are directed from the microlens array to a photocathode surface. A plurality of electron beams are generated from the beamlets using the photocathode surface at 207. The electron beams are extracted from the photocathode surface at 208.

The beamlets can be in an array ranging from, for example, 4×6 to 48×48. Other array configurations are possible. The array may depend on the pitch of the beamlets.

The electron beams can have a density from 2 nA to 5 nA. There may be from 100 to 1000 or from 100 to 2500 electron beams. The electron beams can have a spatial separation from 50 μm to 10 mm or more. Spatial separation of the electron beams 110 in the 10's of mm is possible.

In an instance, the beamlets each have a spot size from 10 μm to 100 μm, and the electron beams generated by the photocathode each have a spot size from 10 μm to 100 μm.

A pattern of the beamlets can be transmitted to the electron beams. Thus, the electron beams can have the same pattern as the beamlets impinging the photocathode surface.

Embodiments disclosed herein enable designs of multiple electron beams and patterning targets with multiple beams of electrons. Any type of light can be used depending on the photocathode material. For inspection, a CW laser or radiation from lamps, diodes, or laser-produced plasmas may be used as light sources. For most photocathode material with high QE, an ultraviolet light source may be used.

Embodiments disclosed herein can be used in reticle or wafer inspection, review, or metrology systems, such as those that use a single electron source or multiple electron sources. Embodiments disclosed herein can be used in systems that use electron sources for generation of x-rays using single or multiple electron sources for use of wafer or reticle, metrology, review or inspection.

Figure 4:
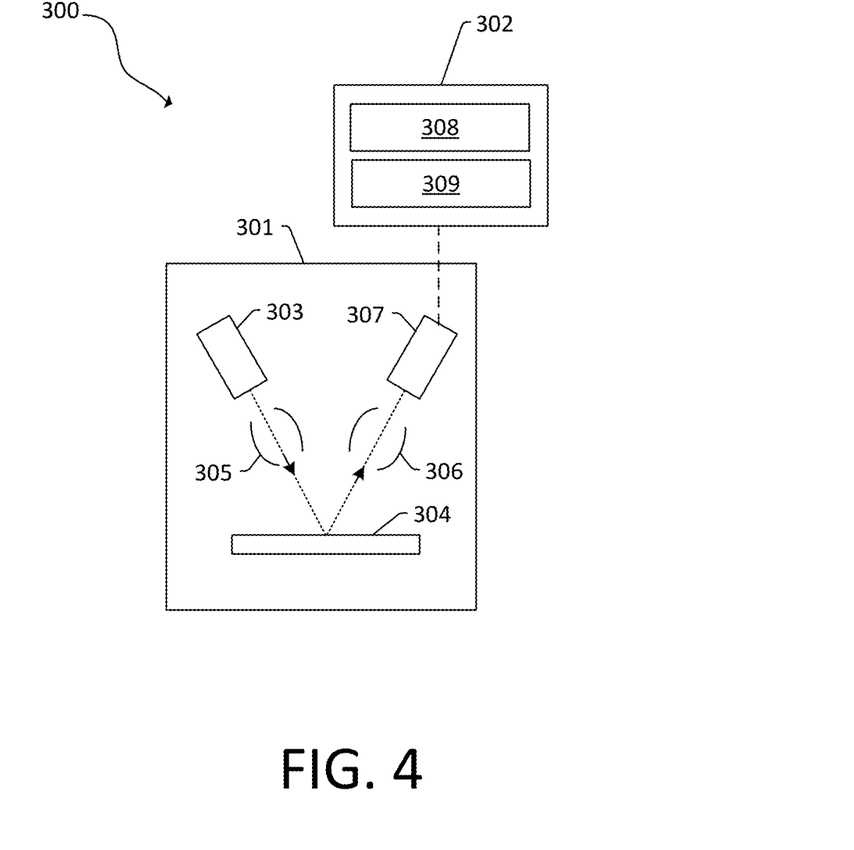
FIG. 4 is block diagram of an embodiment of a system in accordance with the present disclosure.

FIG. 4 is a block diagram of an embodiment of a system 300. The system 300 includes a wafer inspection tool (which includes the electron column 301) configured to generate images of a wafer 304.

The wafer inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 4, the output acquisition subsystem includes electron column 301, which is coupled to computer subsystem 302. A chuck (not illustrated) may hold the wafer 304.

As also shown in FIG. 4, the electron column 301 includes an electron beam source 303 configured to generate electrons that are focused to wafer 304 by one or more elements 305. The electron beam source 303 may include, for example, an embodiment of the diffractive optical element photocathode array system 100 of FIG. 1. The one or more elements 305 may include, for example, a gun lens, an anode, a beam limiting aperture, a gate valve, a beam current selection aperture, an objective lens, and a scanning subsystem, all of which may include any such suitable elements known in the art. The components of the electron beam column also may be part of the elements 305.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The electron column also may include any other suitable elements known in the art.

Although the electron column 301 is shown in FIG. 4 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate images of the wafer 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 such that the computer subsystem 302 is in electronic communication with the detector 307 or other components of the wafer inspection tool. The detector 307 may detect electrons returned from the surface of the wafer 304 thereby forming electron beam images of the wafer 304 with the computer subsystem 302. The electron beam images may include any suitable electron beam images. The computer subsystem 302 includes a processor 308 and an electronic data storage unit 309. The processor 308 may include a microprocessor, a microcontroller, or other devices.

It is noted that FIG. 4 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage unit 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

The system 300 of FIG. 4 is merely one example of a system that can use the diffractive optical element photocathode array system 100 of FIG. 1. Embodiments of the diffractive optical element photocathode array system 100 of FIG. 1 may be part of a defect review system, an inspection system, a metrology system, or some other type of system. Thus, the embodiments disclosed herein describe some configurations that can be tailored in a number of manners for systems having different capabilities that are more or less suitable for different applications.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   a diffractive optical element configured to receive an incident radiation beam, wherein the diffractive optical element forms a plurality of beamlets from the incident radiation beam, and wherein the beamlets each have a spot size from 10 μm to 100 μm;
   an extractor plate;
   a microlens array that provides collimation and focus of the beamlets, wherein the microlens array is disposed between the diffractive optical element and the extractor plate along a path of the beamlets;
   a condenser lens disposed between the diffractive optical element and the microlens array along the path of the beamlets; and
   a photocathode surface disposed between the microlens array and the extractor plate along the path of the beamlets, wherein the photocathode surface generates a plurality of electron beams from the beamlets, and wherein the electron beams generated by the photocathode surface each have a spot size from 10 μm to 100 μm.

2. The system of claim 1, further comprising a laser light source that generates the incident radiation beam.

3. The system of claim 1, wherein the beamlets are in an array.

4. The system of claim 1, wherein the electron beams range from 2 nA to 5 nA.

5. The system of claim 1, wherein the plurality of electron beams includes from 100 to 1000 of the electron beams.

6. The system of claim 1, further comprising an electron beam column, wherein the electron beams are directed at the electron beam column from the extractor plate.

7. The system of claim 6, further comprising a plurality of the electron beam columns, and wherein each of the electron beams is directed at one of the electron beam columns.

8. The system of claim 1, wherein the electron beams have a spatial separation from 50 μm to 10 mm.

9. The system of claim 1, wherein the incident radiation beam is ultraviolet radiation.

10. The system of claim 1, further comprising a voltage source in electronic communication with the extractor plate.

11. A wafer inspection tool comprising the system of claim 1.

12. A method comprising:
generating a radiation beam;
receiving the radiation beam at a diffractive optical element;
forming a plurality of beamlets from the radiation beam using the diffractive optical element, wherein the beamlets each have a spot size from 10 μm to 100 μm;
directing the beamlets through a condenser lens;
collimating and focusing the beamlets with a microlens array downstream of the condenser lens with respect to a direction the beamlets are projected;
directing the beamlets from the microlens array to a photocathode surface;
generating a plurality of electron beams from the beamlets using the photocathode surface, wherein the electron beams generated by the photocathode surface each have a spot size from 10 μm to 100 μm; and
extracting the electron beams from the photocathode surface.

13. The method of claim 12, wherein the beamlets are in an array ranging from 4×6 to 48×48.

14. The method of claim 12, wherein the electron beams range from 2 nA to 5 nA.

15. The method of claim 12, wherein the plurality of electron beams includes from 100 to 1000 of the electron beams.

16. The method of claim 12, wherein the electron beams have a spatial separation from 50 μm to 10 mm.

17. The method of claim 12, wherein the radiation beam is ultraviolet radiation.

18. The method of claim 12, wherein a pattern of the beamlets is transmitted to the electron beams.

* * * * *